United States Patent [19]

Inoue et al.

[11] Patent Number: 4,705,981

[45] Date of Patent: Nov. 10, 1987

[54] ULTRASONIC TRANSDUCER

[75] Inventors: Jiro Inoue; Masaharu Kota, both of Nagaokakyo, Japan

[73] Assignee: Murata Manufacturing Co., Ltd., Japan

[21] Appl. No.: 7,734

[22] Filed: Jan. 28, 1987

[30] Foreign Application Priority Data

Jan. 29, 1986 [JP] Japan ............................ 61-12159[U]

[51] Int. Cl.[4] ............................................ H01L 41/08

[52] U.S. Cl. .................................... 310/324; 310/322; 310/327; 367/180

[58] Field of Search ............................... 310/322, 324; 179/110 A

[56] References Cited

U.S. PATENT DOCUMENTS 3,206,558 9/1965 Shoot ............................. 310/324 X
3,745,384 7/1973 Blanchard ........................... 310/324
3,786,202 1/1974 Schafft ................................ 310/324
4,176,524 12/1979 Kamiyama ....................... 310/324 X
4,373,119 2/1983 Feder .............................. 310/324 X
4,486,742 12/1984 Kudo et al. ...................... 310/324 X
4,556,814 12/1985 Ito et al. .............................. 310/334
4,641,054 2/1987 Takahata et al. ............... 310/322 X

*Primary Examiner*—Mark O. Budd
*Attorney, Agent, or Firm*—Ostrolenk, Faber, Gerb & Soffen

[57] ABSTRACT

An ultrasonic transducer comprises a diaphragm formed by a metal plate provided with a bulged portion in its center and a piezoelectric element bonded to the inner surface of the bulged portion thereby to make the diaphragm vibrate in a bending mode. A node line is present outside the bulged portion in vibration of the diaphragm, and the diaphragm is sandwiched by first and second elastic members along the node line. The first and second elastic members are held between a case and a base fixed thereto so that the diaphragm is elastically retained through the first and second elastic members.

12 Claims, 6 Drawing Figures

ULTRASONIC TRANSDUCER

BACKGROUND OF THE INVENTION

1. Field of the Invention

The present invention relates to an ultrasonic transducer, and more particularly, it relates to an improvement in the structure of an ultrasonic transducer employing a piezoelectric element, such that the transducer can be reduced in thickness.

2. Description of the Prior Art

A drop-proof ultrasonic transducer may be employed in a sensor in an automobile for detecting an obstruction and informing the driver of the same, in case of backing the automobile, for example. Such a transducer performs the functions of transmitting and receiving ultrasonic waves such that, when some obstruction is present in a direction to which the ultrasonic wave is transmitted, the ultrasonic wave transmitted from the transducer is reflected by the obstruction and is received by the same transducer, which thereby detects the presence of the obstruction. Further, the distance between the obstruction and the transducer can be determined by measuring the time from transmission of the ultrasonic wave to receiving of the same by way of the reflection.

A piezoelectric ultrasonic transducer of background interest to the present invention is disclosed in U.S. Pat. No. 4,556,814 issued on Dec. 3, 1985 and granted to Ito et al. In said U.S. Patent, a piezoelectric element is bonded to the inner surface of a top wall of a housing member which has an inverted U-shaped cross-section, while the bottom surface of the housing member is closed by a cover plate. Lead wires are respectively connected to two electrodes of the piezoelectric element for inputting and outputting signals, which lead wires are respectively connected to a pair of terminal pins passing through the cover plate.

The aforementioned transducer operates through bending vibration of the top wall of the housing member. Therefore, the vertical size of the side wall of the housing member must be as large as possible in order to reduce leakage of the bending vibration to the minimum. This prior art patent also discloses an embodiment in which a tubular member having relatively high acoustic impedance is connected to the side wall in order to reduce the decay time caused by transmission of vibration generated in the top wall to the side wall and the cover plate mechanically fixed to the same, thereby to improve a vibration damping effect in the side wall of the housing member.

In the prior art as disclosed in the aforementioned U.S. Patent, the size of transducer is increased since the side wall of the housing member has a large height. Further, assembly of the transducer is complicated in the structure provided with the tubular member.

SUMMARY OF THE INVENTION

Accordingly, an object of the present invention is to provide an ultrasonic transducer which can be reduced in size, particularly in thickness, and which can be readily assembled.

According to the present invention, employed is a diaphragm of metal, which is characterized in its configuration and support mode. The diaphragm has oppositely directed first and second major surfaces and a bulged portion provided in a substantially central portion to outwardly direct the first major surface. The bulged portion is formed by a first annularly extending bent line for outwardly projecting the first major surface and a second annularly extending bent line positioned to encircle the outer side of the first bent line to outwardly project the second major surface. A piezoelectric element is bonded to a region on the second major surface of the diaphragm encircled by the first bent line. Thus, the diaphragm is made to vibrate in a bending mode. In such vibration of the diaphragm, a first node line is present inside the first bent line and a second node line is present outside the second bent line. First and second elastic members are prepared to support the diaphragm. The first and second elastic members are arranged to be respectively in contact with the first and second major surfaces along the second node line of the diaphragm. A base and a case are prepared to hold the diaphragm through the first and second elastic members. The base is adapted to support the diaphragm through the second elastic member. The case has a peripheral wall portion encircling the peripheral edge portion of the base and being substantially fixed to the base and a top wall portion having an opening for receiving the bulged portion of the diaphragm and being in contact with the first elastic member. Thus, the diaphragm is held between the base and the top wall portion through the first and second elastic members, to be elastically retained.

According to the present invention, the diaphragm is elastically held and retained between the top wall portion of the case and the base through the first and second elastic members being in contact with the diaphragm along the second node line, whereby leakage of vibration of the diaphragm is reduced. Thus, there is no need to increase the height of a side wall portion of the case or provide a member for attenuating reverberation as soon as possible as in the conventional transducer. Consequently, the assembling structure is simplified and a thin transducer can be obtained. Further, the case is effectively sealed by the first and second elastic members, thereby to obtain structure suitable for a drop-proof transducer. In addition, the bulged portion of the diaphragm bonded with the piezoelectric element can be exposed from the opening of the top wall portion of the case, whereby a metal material forming the bulged portion can be adjusted in thickness after assembling. Thus, the frequency can be readily adjusted after assembling.

These and other objects, features, aspects and advantages of the present invention will become more apparent from the following detailed description of embodiments of the present invention when taken in conjunction with the accompanying drawings.

DESCRIPTION OF THE PREFERRED EMBODIMENTS

Figure 1:
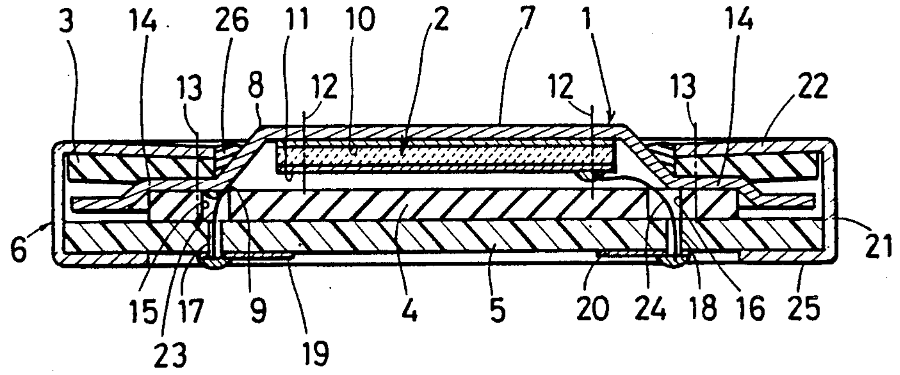
FIG. 1 is a longitudinal sectional view of an ultrasonic transducer according to an embodiment of the present invention.

Referring to FIG. 1, an ultrasonic transducer according to an embodiment of the present invention comprises a diaphragm 1 and a piezoelectric element 2 bonded to its lower surface. Upper and lower surfaces of the diaphragm 1 are sandwiched by first and second elastic members 3 and 4. The lower surface of the second elastic member 4 is covered by a base plate 5. The diaphragm 1, the first and second elastic members 3 and 4 and the base plate 5 are contained in a case 6.

The diaphragm 1 is obtained by discoidally punching a plate of metal such as stainless steel to form a bulged portion 7 in its central portion through embossing. The bulged portion 7 is formed by a first annularly extending bend line 8 for providing an outwardly projecting portion of the upper surface of the diaphragm 1 and a second annularly extending bend line 9 outside the first bend line 8 for providing an outwardly projecting portion of the lower surface of the diaphragm 1.

Figure 2:
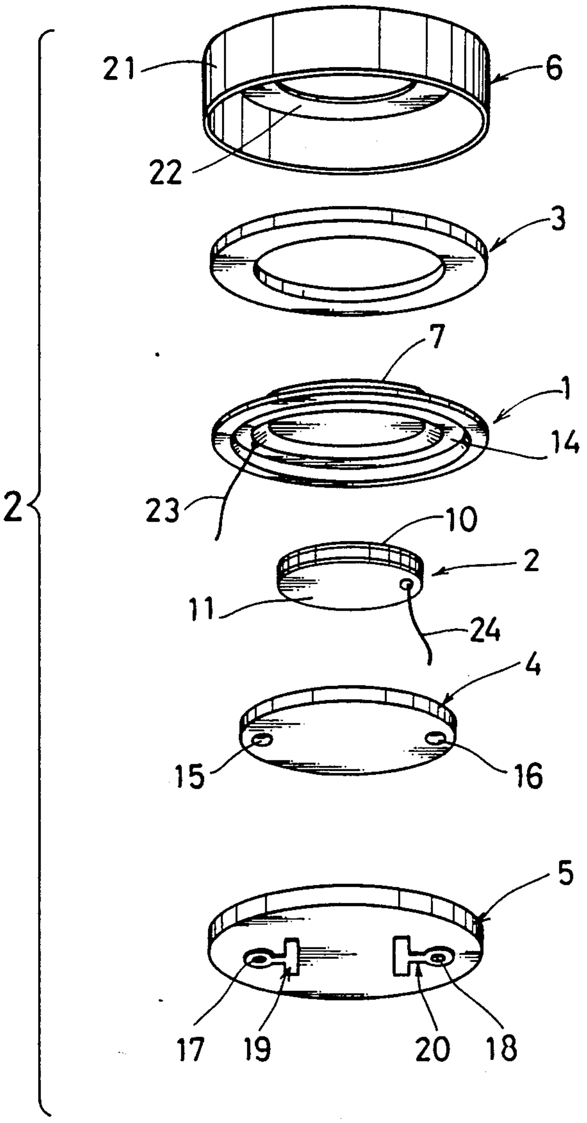
FIG. 2 is an exploded perspective view of the ultrasonic transducer as shown in FIG. 1.

As shown in FIGS. 1 and 2, the piezoelectric element 2 is entirely on the form of a disc, and is provided in its upper and lower surfaces with electrodes 10 and 11 respectively. The piezoelectric element 2 is bonded to a region on the lower surface of the diaphragm 1 encircled by the first bend line 8 by a bonding agent (not shown) by the electrode 10. Thus, the piezoelectric element 2 is received in a space defined by the bulged portion 7 of the diaphragm 1. The bonding agent for bonding the electrode 10 to the diaphragm 1 may be either a conductive type or an insulating type. Particularly when an insulating type bonding agent is employed, the electrode 10 is connected to the diaphragm 1 through capacitive coupling. The piezoelectric element 2 is adapted to make the diaphragm 1 vibrate in a bending mode. When the diaphragm 1, having a shape as shown, vibrates in a bending mode, a first node line 12 is positioned inside the first bend line 8 and a second node line 13 is positioned outside the second bend line 9 in the diaphragm 1. The diaphragm 1 is sandwiched by the first and second elastic members 3 and 4 in a support portion 14 of the diaphragm 1, which includes the second node line 13.

The first elastic member 3 is formed of an elastic sheet material such as rubber, and is in the form of a ring for receiving the bulged portion 7 of the diaphragm 1. The second elastic member 4 is also formed by an elastic material such as rubber, and is in the form of a disc having a diameter substantially identical to the outer diameter of the support portion 14 of the diaphragm 1. A pair of holes 15 and 16 are formed in the peripheral edge portion of the second elastic member 4. The holes 15 and 16 may be replaced by notches.

The base plate 5 is formed of an insulating material such as glass epoxy, and is substantially identical in diameter to the diaphragm 1. The base plate 5 is provided with holes 17 and 18 respectively communicating with the aforementioned holes 15 and 16. Around the peripheries of the holes 17 and 18, conductive patterns 19 and 20 are formed on the lower surface of the base plate 5 to serve as terminals for connection with a circuit (not shown).

Figure 3:
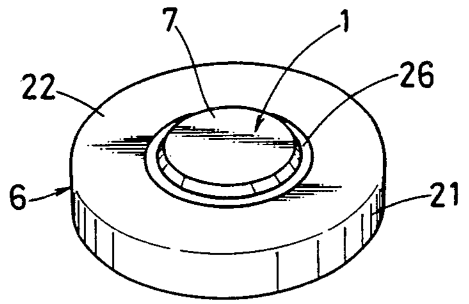
FIG. 3 is a perspective view showing the appearance of the transducer as shown in FIG. 1.

The case 6 is entirely in the form of a cylinder as shown in FIGS. 2 and 3, and has a peripheral wall portion 21 and a top wall portion 22 having an opening in its center. Before the case 6 is thus assembled, the peripheral wall portion 21 extends straightly in the vertical direction as shown in FIG. 2. However, the top wall portion 22 is preferably formed to be at an angle slightly smaller than 90° with respect to the peripheral wall portion 21, as shown in FIG. 1. The case 6 may be formed of metal or resin, the case 6 being preferably obtained of sheet metal or a metal plate.

The electrodes 10 and 11 of the piezoelectric element 2 are electrically connected with the conductive patterns 19 and 20 in the following manner: First, the electrode 10 is electrically connected with the diaphragm 1 directly or by a capacitance. An end of a lead wire 23 is soldered to a position close to the second bend line 9 of the diaphragm 1. The lead wire 23 is soldered to such a position for the following reason: The second bend line 9 is outwardly projected from other portions to facilitate soldering, and is also located in the vicinity of the second node line 13, whereby such connection of the lead wire 23 exerts substantially no influence on vibration of the diaphragm 1. The lead wire 23 passes through the holes 15 and 17, and is soldered to the conductive pattern 19 on the lower surface of the base plate 5. On the other hand, an end of another lead wire 24 is soldered to the electrode 11. The lead wire 24 is preferably soldered in a position as close as possible to the first node line 12, so that vibration of the diaphragm 1 is not influenced by such connection of the lead wire 24. The lead wire 24 passes through the holes 16 and 18, and is soldered to the conductive pattern 20 on the lower surface of the base plate 5. The solder for connecting the lead wires 23 and 24 to the conductive patterns 19 and 20 is preferably applied to close the holes 17 and 18.

The aforementioned first elastic member 3, the diaphragm 1 bonded to the piezoelectric element 2, the second elastic member 4 and the base plate 5 are stacked in this order on the lower surface of the top wall portion 22 of the case 6. In this state, the bulged portion 7 of the diaphragm 1 projects through the opening of the top wall portion 22, thereby to facilitate the reducing in the thickness of the bulged portion 7 for adjusting the frequency after assembling. When it is not necessary to adjust the frequency after assembling, the upper surface of the bulged portion 7 may be flush with or lowered with respect to the upper surface of the top wall portion 22. Thereafter, a lower end portion 25 of the peripheral wall portion 21 of the case 6 is bent and thereby placed against the lower surface of the base plate 5 as shown in FIG. 1. Thus, the base plate 5 exerts force against the second elastic member 4, so that the diaphragm 1 is elastically held, by its support portion 14 by the pressure exerted by the base plate 5 and the top wall portion 22, on the first and second elastic members 3 and 4. The space defined in the bulged portion 7 of the diaphragm 1 is effectively sealed by the first and second elastic members 3 and 4 respectively, which are in pressure contact with the support portion 14 of the diaphragm 1. Such sealing can be further secured as shown in FIG. 1, by forming the top wall portion 22 to be connected with the peripheral wall portion 21 at an angle slightly smaller than 90°.

As shown in FIG. 1, a sealant 26 of, e.g., silicone rubber may be applied to seal the clearance between the diaphragm 1 and the peripheral edge portion defining the opening formed in the top wall portion 22, thereby to further improve the sealing performance.

Figure 4:
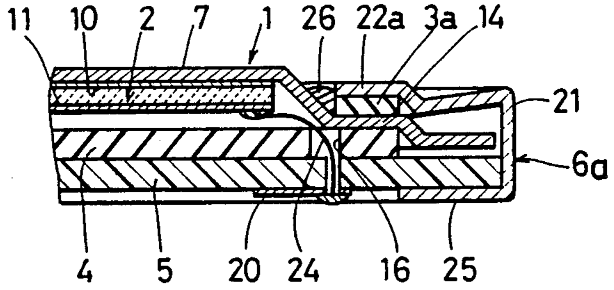
FIG. 4 is a sectional view partially showing an ultrasonic transducer according to another embodiment of the present invention.

FIG. 4 shows a modification of the embodiment as shown in FIG. 1. In this embodiment, a first elastic member 3*a* is made to have a smaller outer diameter than the elastic member 3 as shown in FIG. 1, while a top wall portion 22*a* of a case 6*a* has a bent configuration. An annular and radially inward portion of the top wall portion 22*a* presses against the first elastic member 3*a* and is as parallel as possible thereto in the radial direction. A radially outward portion of the top wall portion 22*a* may be bent to form an angle slightly smaller than 90° with the peripheral wall portion 21. Other structure of this embodiment is similar to that shown in FIG. 1, and hence detailed description thereof is omitted with similar reference numerals being assigned to corresponding elements.

Figure 5:
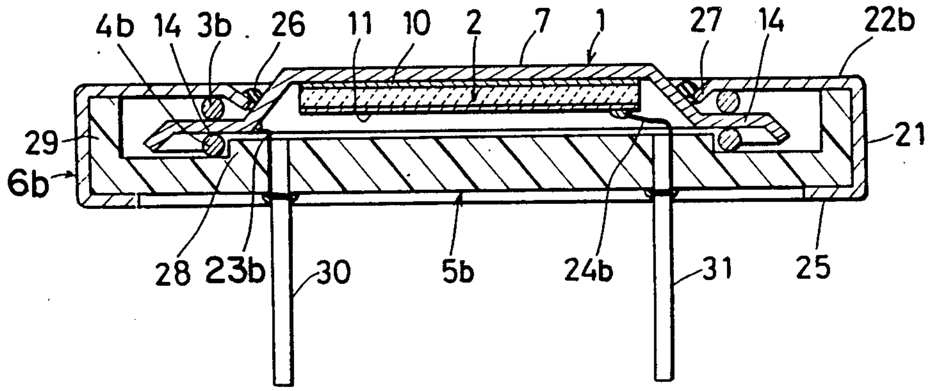
FIG. 5 is a longitudinal sectional view of an ultrasonic transducer according to still another embodiment of the present invention.

Referring to FIG. 5, a description is now made of still another embodiment of the present invention. In FIG. 5, elements corresponding to those of the embodiment as shown in FIG. 1 are indicated by similar reference numerals, to omit redundant description. As compared with the embodiment of FIG. 1, the embodiment as shown in FIG. 5 has the following characteristics:

First and second elastic members 3*b* and 4*b* are made of an elastic material such as silicone rubber, and each have the form of a ring with a substantially circular section.

A radially inward peripheral edge portion 27 for defining an opening in a top wall portion 22*b* of a case 6*b* is downwardly bent so as to locate the first elastic member 3*b*. On the other hand, a base plate 5*b* is provided with an upwardly projecting portion 28 for locating the second elastic member 4.

Further, an upwardly projecting spacer 29 is integrally formed in the peripheral edge portion of the base plate 5*b*. The spacer 29 may be prepared independently of the base plate 5*b*, and thereafter placed on the base plate 5*b*. Such a spacer 29 facilitates maintaining a constant distance between the top wall portion 22*b* and the lower portion 25 of the case 6*b*, thereby to prevent irregular application of compressive force to the first and second elastic members 3*b* and 4*b* depending on the degree of bending of the lower portion 25 as shown in FIG. 5.

In the embodiment of FIG. 5, further provided are a pair of terminal pins 30 and 31 to serve as external terminals. The terminal pins 30 and 31 are respectively inserted in through holes formed in the base plate 5*b*, and fixed to the base plate 5*b*. Lead wires 23*b* and 24*b* are guided through the through holes receiving the terminal pins 30 and 31, wound around the terminal pins 30 and 31, and soldered thereto at the lower surface of the base plate 5*b*. The portions of the base plate 5*b* receiving the terminal pins 30 and 31 and the lead wires 23*b* and 24*b* are preferably sealed by appropriate means. The lead wires 23*b* and 24*b* may also be passed to the lower surface of the base plate 5*b* through other through holes (not shown) separated from those receiving the terminal pins 30 and 31.

Figure 6:
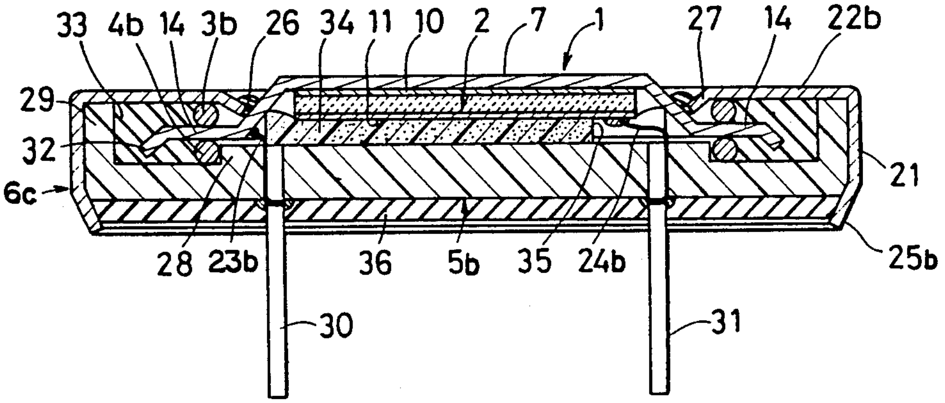
FIG. 6 is a longitudinal sectional view of an ultrasonic transducer according to a further embodiment of the present invention.

FIG. 6 shows a further embodiment of the present invention, which is similar to the embodiment as shown in FIG. 5. Thus, corresponding portions are indicated by similar reference numerals, thereby to omit redundant description.

The embodiment as shown in FIG. 6 is characterized in that an elastic resin member 33 of silicone resin or the like is provided to fill in the spaces around a peripheral edge portion 32 of the diaphragm 1. The elastic resin member 33 is formed by introducing unhardened resin between a spacer 29 and the first elastic member 3*b*, with the first and second elastic members 3*b* and 4*b* and the diaphragm 1 having been placed on the base plate 5*b* before the base plate 5*b* is assembled in a case 6, for example. Such an elastic resin member 33 fills in a space defined by the first and second elastic members 3*b* and 4*b*, the base plate 5*b* and the case 6*c*, thereby to damp vibration of the diaphragm 1. Such a damping effect promptly causes attenuation of the vibration in both transmission and receiving of ultrasonic waves and reduces the decay time.

In the embodiment as shown in FIG. 6*c*, further, a sound absorbing member 34 is provided between the piezoelectric element 2 and the base plate 5*b*. The sound absorbing member 34 is formed of, e.g., a porous silicone rubber sheet, and is retained in a compressed state between the piezoelectric element 2 and the base plate 5*b*. The sound absorbing member 34 is in direct contact with the piezoelectric element 2, thereby to effectively absorb undesired spurious vibration generated by the piezoelectric element 2. The sound absorbing member 34 is provided with a notch 35, through which a lead wire 24*b* is guided.

In addition, a lower portion 25*b* of the peripheral wall portion 21 of the case 6*c* is further bent inwardly toward the peripheral edge portion of the base plate 5*b*. Thus, a container type space is defined by the lower end portion 25*b* and the base plate 5*b*. Resin such as epoxy resin or silicone resin is poured into said space, thereby to form a sealant 36. The sealant 36 reliably prevents any clearance from being created by a difference in thermal expansion coefficient between the base plate 5*b* and the case 6*c* or the terminal pins 30 and 31.

The terms "upward", "downward", and the like are used herein only for illustrative purposes with reference to the drawings, no limitation of the structure of the invention being intended.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A compact ultrasonic transducer comprising:

a metal diaphragm having an upwardly directed first major surface and a downwardly directed second major surface, said diaphragm having a main plane and a bulged portion which projects upwardly of said main plane, said bulged portion being formed by first and second substantially circular bend lines, said second bend line being in said main plane, and said first bend line being disposed upward and radially inward of said second bend line;

a piezoelectric element bonded to said second major surface in said bulged portion, for causing said diaphragm to vibrate in a bending mode with a first node line being in said bulged portion radially inward of said first bend line; and a second node line being in said main plane, radially outward of said second bend line;

first and second elastic members contacting said first and second major surfaces, respectively, along said second node line of said diaphragm;

a base supporting said second elastic member and thereby supporting said diaphragm; and a case having a peripheral wall portion, said peripheral wall portion surrounding a peripheral edge portion of said base and being secured to said base, said case further having a top portion which contacts said first elastic member and has an opening defined therein for receiving said bulged portion of said diaphragm, whereby said diaphragm is held and retained between said base and said top portion of said case via said first and second elastic members, with said bulged portion of said diaphragm projecting upwardly of said top portion of said case.

2. An ultrasonic transducer in accordance with claim 1, further including a spacer which is provided on said peripheral edge portion of said base for surrounding said diaphragm and contacting said top portion of said case.

3. An ultrasonic transducer in accordance with claim 2, wherein said spacer is formed integrally with said base.

4. An ultrasonic transducer in accordance with claim 1, further including a sound absorbing member secured to a portion of said base on a side thereof away from said piezoelectric element.

5. An ultrasonic transducer in accordance with claim 1, wherein said piezoelectric element is provided on a surface thereof directed toward said base with a first electrode, and said transducer further includes a first lead wire soldered to said first electrode in the vicinity of said first node line.

6. An ultrasonic transducer in accordance with claim 1, wherein said piezoelectric element is provided on a surface thereof bonded to said diaphragm with a second electrode, and said transducer further includes a second lead wire soldered to said diaphragm in the vicinity of said second bend line.

7. An ultrasonic transducer in accordance with claim 1, further including a sealant for sealing a clearance between said diaphragm and a radially inward upper edge portion of said case defining said opening of said case.

8. An ultrasonic transducer in accordance with claim 1, wherein said peripheral wall portion of said case has a crimped portion which projects radially inward from said peripheral edge portion of said base on a side thereof away from said top portion of said case, and said transducer further includes a resin member which fills a space defined by said crimped portion of said peripheral wall portion and said base.

9. An ultrasonic transducer in accordance with claim 1, further including a resin member which fills a space defined by said first and second elastic members, said base and said case, and thereby encloses a peripheral edge portion of said diagram.

10. An ultrasonic transducer in accordance with claim 1, wherein said first and second elastic members both have substantially the form of plates.

11. An ultrasonic transducer in accordance with claim 1, wherein said first and second elastic members both have the form of rings with substantially circular cross-sections.

12. An ultrasonic transducer in accordance with claim 11, wherein said top portion of said case has means for locating said first elastic member and said base has means for locating said second elastic member.

* * * * *